US005098814A

United States Patent [19]

Tunney et al.

[11] Patent Number: 5,098,814

[45] Date of Patent: Mar. 24, 1992

[54] LAMINATE FOR THE FORMATION OF BEAM LEADS FOR IC CHIP BONDING

[75] Inventors: Scott E. Tunney, Ontario; John J. Fitzgerald, Webster, both of N.Y.

[73] Assignee: Eastman Kodak Company, Rochester, N.Y.

[21] Appl. No.: 514,814

[22] Filed: Apr. 26, 1990

[51] Int. Cl.[5] ........................ G03C 7/075; G03F 7/09

[52] U.S. Cl. .................................... 430/275; 430/281; 430/288

[58] Field of Search ........................ 430/281, 288, 275

[56] References Cited

U.S. PATENT DOCUMENTS

| | | | |
|---|---|---|---|
| 3,620,736 | 11/1971 | Tarkington | 96/36 |
| 3,748,133 | 7/1973 | Noonan et al. | 96/35.1 |
| 4,147,552 | 4/1979 | Specht et al. | 96/35.1 |
| 4,247,623 | 1/1981 | Guild | 430/275 |
| 4,289,844 | 9/1981 | Specht et al. | 430/281 |
| 4,342,151 | 8/1982 | Guild | 430/288 X |
| 4,499,149 | 2/1985 | Berger | 428/447 |
| 4,727,126 | 2/1988 | Chen | 526/302 |
| 4,767,883 | 8/1988 | Molaire | 560/220 |
| 4,792,517 | 12/1988 | Klein et al. | 430/288 X |
| 4,803,147 | 2/1989 | Mueller et al. | 430/288 |
| 4,865,950 | 9/1989 | DoMinh | 430/906 X |
| 4,902,605 | 2/1990 | Klein et al. | 430/288 X |

OTHER PUBLICATIONS

Summers et al., Polymer Preprints 27, 403–405 (1986).
Yilgor et al., Polysiloxane Containing Polymers: A Survey of Recent Developments in "Polysiloxane Copolymers/Anionic Polymerization", Springer-Verlag, Berlin, W. Ger.(1988).
Iskender Vilgor, Polymer Sci. Tech. 37 Adhesives: Sealants, Coatings, Space Harsh Environment, pp. 249–264 (1988).

*Primary Examiner*—Cynthia Hamilton
*Attorney, Agent, or Firm*—Robert L. Walker

[57] ABSTRACT

A laminate, adapted for manufacturing frames of metal beam leads that are bonded to integrated circuit chips comprising:

(a) a flexible metal strip (b) a layer of a first resist adhered to one surface of the metal strip, and (c) a layer of a second resist adhered to the opposite surface of the metal strip, wherein the second resist is a negative-working resist which forms a semi-interpenetrating polymer network-II upon curing and comprises a homogeneous blend.

(A) a solvent soluble polyimide-siloxane containing about 0.5–30 weight percent silicon and (B) an ethylenically unsaturated multifunctional monomer. The siloxane units in the polyimide-siloxane have from 10 to about 200

$$-\overset{|}{\underset{|}{Si}}-O$$

linkages per unit, more preferably from about 15 to about 100 linkages, and most preferably from about 40 to about 100 linkages per siloxane unit. A second embodiment of the invention comprises a metal strip having one side thereof, a composition obtained by curing the above-identified curable composition. Curable compositions of this invention can be cured by either actinic radiation; for example, ultraviolet light, or by thermal radiation. In the cured composition, the polymer produced upon polymerization of the monomer, and the polyimide portion of the polyimide-siloxane form a homogeneous blend, in which the siloxane portion of the polyimide-siloxane is phase separated. The cured composition is a semi-interpenetrating network. The cured composition is especially useful in the fabrication of electronic devices such as frames of metal beam leads to be bonded to integrated circuit (IC) chips since it reduces stress at the polymer/metal interface, thereby reducing curl in such thin, coated objects.

21 Claims, No Drawings

LAMINATE FOR THE FORMATION OF BEAM LEADS FOR IC CHIP BONDING

CROSS REFERENCE TO RELATED APPLICATION

Reference is hereby made to commonly-assigned U.S. patent application Ser. No. 07-514,776 entitled CURABLE COMPOSITION filed in the names of S. E. Tunney and J. J. Fitzgerald concurrently herewith.

FIELD OF THE INVENTION

This invention relates to a laminate adapted for manufacturing frames of metal beam leads that are bonded to integrated circuit chips, preferably by automated equipment.

BACKGROUND OF THE INVENTION

One of the most costly aspects of IC technology is bonding the IC chip to the rest of the circuit package. A solution to this problem comprises automated bonding of metal beam leads to the IC chip, thus avoiding manual wire bonding. Such a technique uses a roll of a laminate that carries to a bonding station a plurality of frames, each of which has many generally planar microscopic, spider-shaped metal fingers known as beam leads. At the bonding station the inner portions of the beam leads are aligned and then simultaneously connected to the bonding sites on the IC chip. The outer portion of the beam leads is then available for bonding to remaining portions of the circuit package.

Such beam leads can be manufactured by a photoresist process. Guild U.S. Pat. No. 4,247,623 discloses such a process and a blank or laminate for use therein having a structure comprising a flexible strip of electrically conductive metal, a layer of resist adhered to one surface of the metal strip, and a layer of resist adhered to the opposite surface of the metal strip. The process includes the steps of imagewise exposing and developing the resists. One developed resist forms a protective coating on the beam lead portions of the metallic layer. The exposed metallic layer is subsequently etched to form the beam leads. The other developed resist forms a window-bearing support spacer holding the beam leads in the desired orientation. The beam leads are maintained in their proper orientation prior to and during bonding by the spacer formed from such resist.

While the three layer blanks and the process provided by Guild represent a significant advance in the art, the materials suggested by Guild for use in his invention are not satisfactory for some high temperature operations. Furthermore, those materials cause stress at the polymer/metal interface resulting in curl of the product. In other words, the beam leads do not stay in a flat plane.

Klein, U.S. Pat. No. 4,792,517 discloses a laminate for the formation of beam leads for IC chip bonding which include a layer of a resist which is used to form a support spacer exhibiting good dimensional integrity and hardness at processing temperatures of 200° C. and higher. The spacer functions to support the leads prior to, during, and after the bonding of the IC chip. While the laminate described in U.S. Pat. No. 4,792,517 provides, under most conditions, superior beam leads. However, in high humidity environments, it undergoes hydrolytic degeneration. Furthermore, materials provided by Klein can lead to curl of the thin laminated product.

One proposed solution to the curl problem recognized in the art is to use a thinner (i.e. narrower) polymer coating to reduce curl. This results in less coverage of metal parts, and the unnecessary plating of gold to exposed metal areas in subsequent steps. The unnecessary plating of gold results in a significant cost increase.

In previous work by the present inventors, they demonstrated that it was possible to provide improvements over the compositions suggested by Guild and Klein. More specifically, the current inventors were able to show that certain soluble polyimides, and the siloxane modified polyimides suggested by Mueller et al, U.S. Pat. No. 4,803,147, provided significant high temperature and hydrolytic stability. However, these materials did not adequately solve the curl problem referred to above.

Now, with the present invention, Applicants have provided laminates which have good high temperature properties, good hydrolytic stability, and significantly reduced curl. Hence, the laminates of this invention represent a significant advance in the art. Stated another way, the laminates of the present invention have a combination of desirable properties which is not attainable with prior art laminates.

In short, a need exists for laminates with good high temperature properties, hydrolytic stability, and reduced curl. This invention satisfies that need.

SUMMARY OF THE INVENTION

We have discovered an improved dielectric support resist featuring the advantages of the resist described in U.S. Pat. No. 4,792,517 and which exhibits lower moisture sensitivity, improved hydrolytic stability, better high temperature resistance, and reduced tendency to curl.

More specifically, in one embodiment of this invention there is provided a laminate comprising:

(a) a flexible metal strip, (b) A layer of a first resist adhered to one surface of said metal strip, and (c) a layer of a second resist adhered to the opposite surface of said metal strip, wherein said second resist is a negative-working resist which forms a semi-interpenetrating polymer network upon curing and comprises a homogeneous mixture of (A) a solvent soluble linear polyimide-siloxane having from about 0.5 to about 30 weight percent silicon, said silicon being in siloxane units in said polyimide-siloxane, said siloxane units having from about 10 to about 200

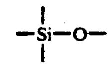

linkages per unit, (B) an ethylenically unsaturated multifunctional monomer;

the relative concentration of (A) and (B) being such that said mixture provides upon curing a homogeneous blend of (i) the polyimide portion of said polyimide-siloxane and (ii) the polymer produced from said monomer, in which said siloxane portion of said polyimide-siloxane is phase separated.

In another embodiment, there is provided a laminate comprising:

(a) a flexible metal strip, (b) on one side of said strip, a cured composition of (A) a solvent soluble polyimide-siloxane containing from about 2 to about 30 weight percent silicon, said silicon being in siloxane units having from about 15 to about 200

$$-\overset{|}{\underset{|}{Si}}-O-$$

units per chain, and (b) a polymer of a multifunctional ethylenically unsaturated monomer;

said polymer and the polyimide portion of said polyimide-siloxane forming a homogenous blend in which the siloxane portion of the polyimide-siloxane is phase separated, said cured composition having two glass transition temperatures.

Laminates of this invention can be processed at high temperatures, and the second resist and the support formed therefrom exhibit lower moisture sensitivity and improved hydrolytic stability.

The utility of the above-described type of homogeneous blend in curable and imageable compositions is due at least partly to its ability to form a semi-interpenetrating polymer network upon curing. As is well known to those skilled in the art, interpenetrating polymer networks (IPNs) contain at least two polymers, each in network form. In semi-interpenetrating polymer network-II (semi-IPNs-II), a first polymer is linear and a second polymer is polymerized in its presence and forms a cross-linked network. As used herein, the term "semi-interpenetrating polymer network-II" is intended to mean a polymer network including a first polymer in linear form and a second polymer in cross-linked network form. Semi-IPNs-II and IPNs are described in further detail in *Interpenetrating Polymer Networks and Related Materials* by L. H. Sperling, Lehigh University, Bethlehem, Pa., Plenum Press (1980).

The cured compositions of this invention have a highly important aspect which confers many useful properties such as reduced stress at the polymer/metal interface, good Young's modulus, and good elongation to break. Specifically, in the cured compositions of this invention the siloxane portion of the polyimide-siloxane is phase separated from the blend of the polymer (produced from the monomer) and the polyimide portion of the polyimide-siloxane.

The laminate of this invention is described primarily in connection with a process for manufacturing frames of metal beam leads that are bonded to IC chips. In addition, the invention is also particularly useful in other photofabrication systems using resists on opposite sides of a workpiece.

As stated, the laminate of this invention comprises a flexible metal strip. Any electrically conductive metallic layer can be used in the invention. Preferred are copper, aluminum, and other similar metals favored for use as beam leads in bonding IC chips.

With respect to the first resist composition, any negative- or positive-working resist capable of adhering to the selected metallic layer can be used. The choice is not critical, and conventional formulations are acceptable. Suitable positive-working resists comprise, in general, any insoluble, light-sensitive material that becomes removable in a developer of choice when exposed, and an optional filler or binder such as a poly(acrylic acid) or a copolymer of ethyl acrylate and methacrylic acid. Particularly useful positive-working light-sensitive materials are cresol-formaldehyde resins condensed with quinone diazides. U.S. Pat. No. 4,141,733, issued Feb. 27, 1979, provides additional examples, as does U.S. Pat. No. 4,684,597. Suitable negative-working compositions include conventional negative-working photoresists such as bisazide/cyclized polyisoprenes and phenolic resins.

The laminate of this invention is provided with a layer of a second resist adhered to the metal strip. The second resist is a negative-working resist which forms a semi-interpenetrating polymer network-II upon exposure and comprises a homogeneous blend of a binder comprising a solvent soluble linear polyimide-siloxane and at least one polymerizable multifunctional monomer. The polyimide-siloxane useful in the second resist in the laminate of the invention are linear and solvent soluble. By "linear" it is meant that the polyimide-siloxane consists essentially of recurring units containing cyclic imide units in the polymer backbone, and that such recurring units are present essentially in the form of long chains. The polyimide-siloxane must be essentially free of pendant unsaturation.

By "solvent soluble" it is meant that the polyimide-siloxane must be at least slightly soluble in organic solvents, e.g., 1,1,1-trichloroethane, methylene chloride, or other common organic solvents, examples of which include the following:

N,N-dimethylformamide,
N,N-dimethylacetamide,
N-methyl-2-pyrrolidone,
N,N-diethylformamide,
N,N-diethylacetamide,
N-methylcaprolactam,
dioxane,
dimethylsulfoxide,
tetramethylurea,
pyridine,
dimethylsulfone,
hexamethylphosphoramide,
tetramethylene sulfone,
formamide,
N-methylformamide,
γ-butyrolactone,
tetrahydrofuran,
m-cresol,
2-methoxyethyl acetate,
1,2-dimethoxyethane,
bis(2-methoxyethyl)ether,
chloroform,
chlorobenzene,
cyclohexanone and
nitrobenzene.

The solvents can be used alone, in combinations, or in combination with so-called poor solvents such as benzene, benzonitrile, xylene, toluene and cyclohexane. More specifically, by "slightly soluble" it is meant that the polyimide-siloxane is soluble in an amount of at least about 1%, more preferably 10–20% or more by weight in the selected solvent.

Particularly preferred polyimides contain recurring units having the structural formula:

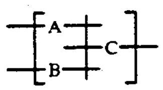

wherein A is selected from a phenylindane radical having the structural formula

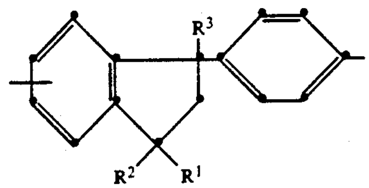

wherein $R^1$, $R^2$ and $R^3$ are individually H or or an alkyl group preferably containing from 1 to 5 carbon atoms; or a group having the structural formula

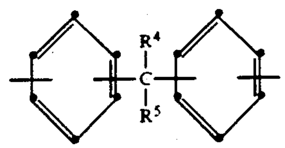

wherein $R^4$ and $R^5$ are individually H, alkyl of from 1 to 5 carbon atoms or fluoroalky, the alkyl portion of which preferably contains from 1 to 5 carbon atoms. In Formula (I), B is a group having the structural formula

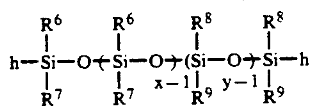

wherein each h is a linking group independently selected from alkyl and fluoroalkyl groups having up to about 5 carbon atoms, and aryl groups having up to about 10 carbon atoms. Preferably, both h radicals are the same. It is also preferred that the perfluoroalkyl groups have the formula $-CH_2)_nCF_3$ wherein n has a value of from 0 to about 4. When h is an aryl group, it may be a phenyl radical, an alkyl substituted phenyl radical, or a naphthyl radical.

In Formula (IV), $R^6$, $R^7$, $R^8$, and $R^9$ are selected from alkyl, aryl, and fluoroalkyl groups of the type referred to above. The values of x and y are each from 0 to about 200, such that the value of $(x+y)$ is from 10 to about 200, more preferably from about 15 to about 200, and even more preferably from about 40 to about 60.

In the Formula (I), C can be selected from a group having the structural formula

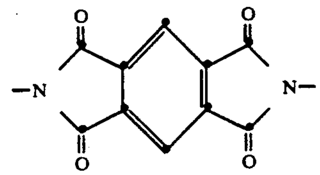

or

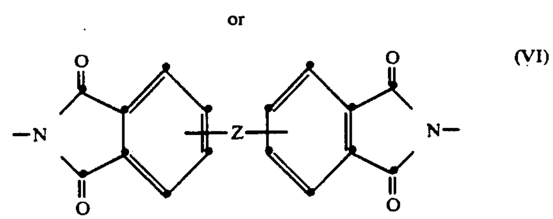

wherein Z is

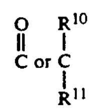

wherein $R^{10}$ and $R^{11}$ are H, alkyl or fluoroalkyl, and wherein said fluoroalkyl groups are as discussed above.

Representative species of highly preferred polyimide-siloxanes which have been found to be useful in the practice of this invention include

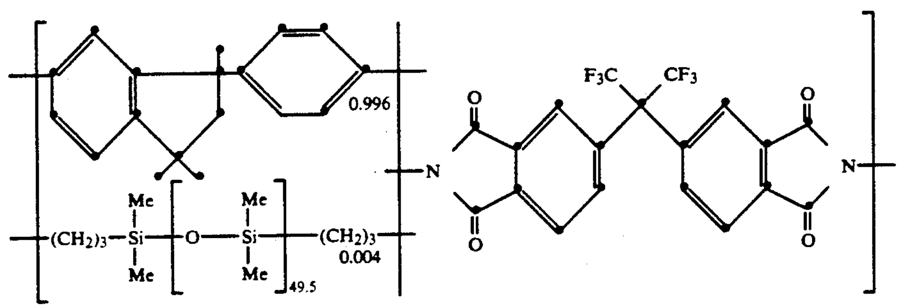

-continued

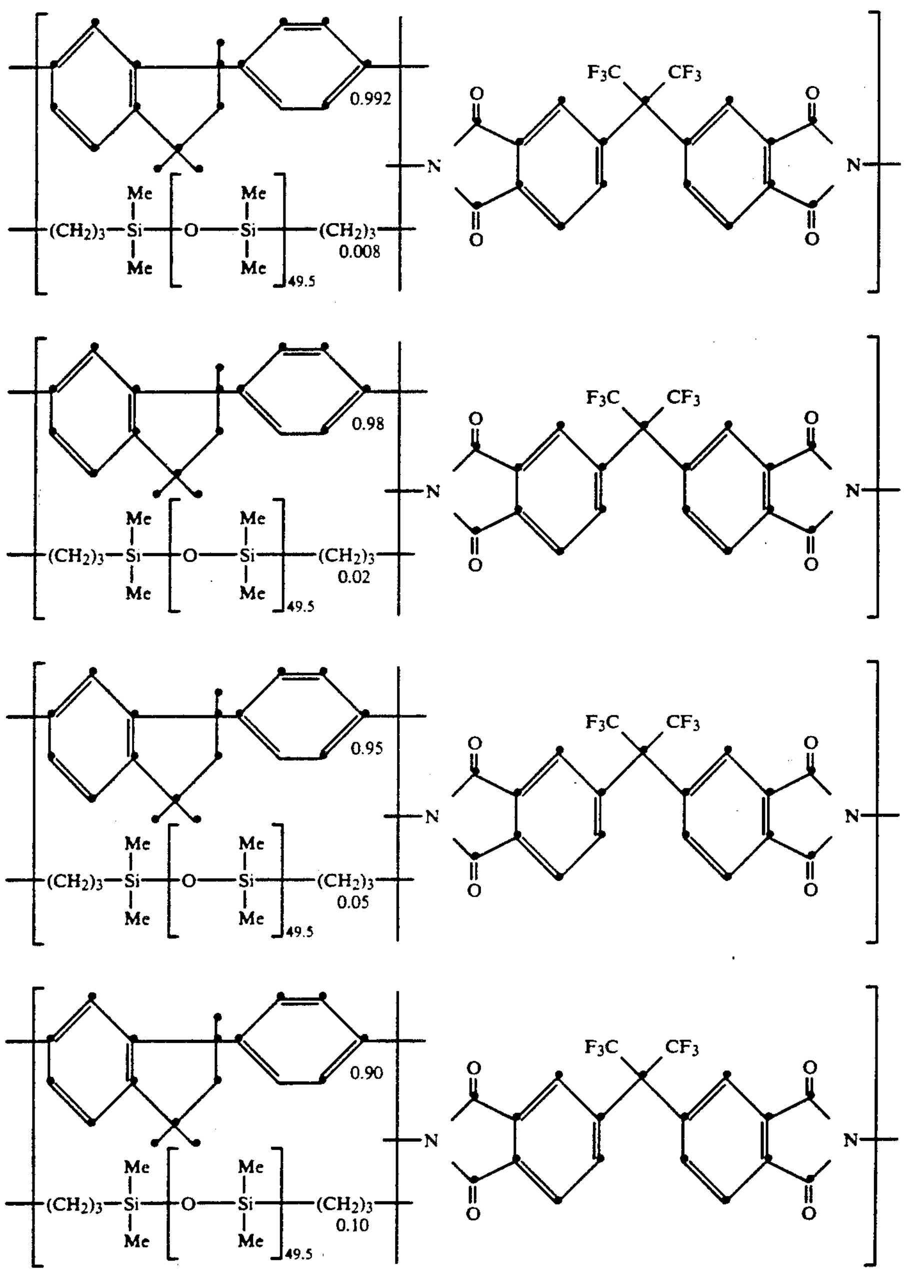

In the above formulas the subscripts to the right of Components A and B give molar ratios. For example, in the last composites mentioned above, there are 90 molar portions of Component A and 10 molar portions of Component C. Linear polyimide-siloxanes useful in the practice of this invention can be derived from a variety of diamines and dianhydrides. The diamines that can be employed in the preparation of the polyimides useful herein include the phenylindane diamines described in U.S. Pat. No. 3,856,752, examples of which include, 5-amino-1-(4'-aminophenyl)-1,3,3-trimethylindane,
6-amino-1-(4'-aminophenyl)-1,3,3-trimethylindane, optionally substituted with alkyl, halogen or fluoroalkyl, and aromatic diamines, for example,
4,4'-methylenebis(o-chloroaniline),
3,3'-dichlorobenzidine,
3,3'-sulfonyldianiline,
4,4'-diaminobenzophenone,
1,5-diaminonaphthalene,
bis(4-aminophenyl)diethyl silane,
bis(4-aminophenyl)diphenyl silane,
bis(4-aminophenyl)ethyl phosphine oxide,
N-(bis(4-aminophenyl))N-methyl amine,
N-(bis(4-aminophenyl))N-phenyl amine,
4,4'-methylenebis(2-methylaniline),
4,4'-methylenebis(2-methoxyaniline),
5,5'-methylenebis(2-aminophenol),
4,4'-methylenebis(2-methylaniline),
4,4'-oxybis(2-methoxyaniline),
4,4'-oxybis(2-chloroaniline),
2,2'-bis(4-aminophenol),
5,5'-oxybis(2-aminophenol),
4,4'-thiobis(2-methylaniline),
4,4'-thiobis(2-methoxyaniline), 4,4'-thiobis(2-chloroaniline),
4,4'-sulfonylbis(2-methylaniline),
4,4'-sulfonylbis(2-ethoxyaniline),
4,4'-sulfonylbis(2-chloroaniline),
5,5'-sulfonylbis(2-aminophenol),
3,3'-dimethyl-4,4'-diaminobenzophenone,
3,3'-dimethoxy-4,4'-diaminobenzophenone,
3,3'-dichloro-4,4'-diaminobenzophenone,
4,4'-diaminobiphenyl,
m-phenylenediamine,
p-phenylenediamine,
4,4'-methylenedianiline,
4,4'-oxydianiline,
4,4'-thiodianiline,
4,4'-sulfonyldianiline,
4,4'-isopropylidenedianiline,
3,3'-dimethylbenzidine,
3,3'-dimethoxybenzidine,
3,3'-dicarboxybenzidine and diaminotoluene.

Aromatic polyimide-siloxanes for this invention can also be made from the benzhydrols disclosed in U.S. Pat. No. 4,736,015. Siloxane diamines for the preparation of polyimide-siloxanes for this invention can be selected from appropriate materials in U.S. Pat. No. 4,499,149.

Dianhydrides that can be employed in the preparation of the polyimide-siloxanes useful herein include the dianhydrides described in U.S. Pat. No. 3,856,752, examples of which include phenylindane dianhydrides, such as 1-(3',4'-dicarboxyphenyl)-1,3,3-trimethylindane-5,6-dicarboxylic acid dianhydride,
1-(3',4'-dicarboxyphenyl)-1,3,3-trimethylindane-6,7-dicarboxylic acid dianhydride,
1-(3',4'-dicarboxyphenyl)-3-methylindane-5,6-dicarboxylic acid dianhydride,
1-(3',4'-dicarboxyphenyl)-3-methylindane-6,7-dicarboxylic acid dianhydride, and other dianhydrides, preferably aromatic dianhydrides or tetracarboxylic acid dianhydrides, such as
2,3,9,10-perylene tetracarboxylic acid dianhydride,
1,4,5,8-naphthalene tetracarboxylic acid dianhydride,
2,6-dichloronaphthalene-1,4,5,8-tetracarboxylic acid dianhydride,
2,7-dichloronaphthalene-1,4,5,8-tetracarboxylic acid dianhydride,
2,3,6,7-tetrachloronaphthalene-1,4,5,8-tetracarboxylic acid dianhydride,
phenanthrene-1,8,9,10-tetracarboxylic acid dianhydride,
2,3,3',4'-benzophenonetetracarboxylic acid dianhydride,
pyromellitic dianhydride,
3,3',4,4'-benzophenonetetracarboxylic acid dianhydride,
2,2',3,3'-benzophenonetetracarboxylic acid dianhydride,
3,3',4,4'-biphenyltetracarboxylic acid dianhydride,
2,2',3,3'-biphenyltetracarboxylic acid dianhydride,
4,4'-isopropylidenediphthalic anhydride,
3,3'-isopropylidenediphthalic anhydride,
4,4'-oxydiphthalic anhydride,
4,4'-sulfonyldiphthalic anhydride,
3,3'-oxydiphthalic anhydride,
4,4'-methylenediphthalic anhydride,
4,4'-thiodiphthalic anhydride,
4,4-ethylidenediphthalic anhydride,
2,3,6,7-naphthalenetetracarboxylic acid dianhydride,
1,2,4,5-naphthalenetetracarboxylic acid dianhydride,
1,2,5,6-naphthalenetetracarboxylic acid dianhydride,
benzene-1,2,3,4-tetracarboxylic acid dianhydride,
pyrazine-2,3,5,6-tetracarboxylic acid dianhydride and
thiophene-2,3,4,5-tetracarboxylic acid dianhydride.

The diamines, diaminosiloxanes, and dianhydrides described above are known compounds and/or can be prepared by one skilled in the art by known procedures.

The above-described solvent soluble polyimide-siloxanes useful in the practice of this invention are known and/or can be prepared by techniques well known to those skilled in the art. For example, the polyimide-siloxanes can be prepared by reacting diamines with dianhydrides in an organic reaction medium such as described in U.S. Pat. No. 3,856,752 cited above to form a polyamic acid which is subsequently converted to the polyimide-siloxane by known techniques, for example, by chemical and/or thermal methods. An illustrative preparation is set forth below. Polyimide-siloxanes useful herein can also be prepared by reacting a diisocyanate with a dianhydride such as described in U.S. Pat. No. 3,708,458.

The composition of this invention includes at least one polymerizable multifunctional monomer. A preferred class of multifunctional monomers is multifunctional acrylates. Useful acrylates include diacrylates, triacrylates, tetraacrylates, pentaacrylates, hexaacrylates, and the like. Exemplary preferred species include 1,6-hexanediol diacrylate,
neopentyl glycol diacrylate,
ethylene glycol diacrylate,
diethylene glycol diacrylate,
polyethylene glycol diacrylate,
pentaerythritol triacrylate,
1,2,4-butanetriol triacrylate,
trimethylolpropane triacrylate,
glycerol triacrylate,
tetramethylolmethane tetraacrylate,
tetraethylene glycol diacrylate,
nonaethylene glycol diacrylate,
methylene diacrylate, ethylene diacrylate
pentaerythritol diacrylate,
glycerol diacrylate,
1,3-propylene diacrylate,
1,3-propylene glycol diacrylate,
1,5-pentanediol diacrylate,
dipentaerythritol hexaacrylate,
1,4-benzenediol diacrylate,
1,4-cyclohexane diacrylate,
1,4-cyclohexane dimethanol diacrylate, and
tris(acryloyloxyethyl)-1,2,4-benzenetricarboxylate.

A particularly preferred class of diacrylates comprises 1,4-cyclohexylene bis(oxyalkyl) diacrylates, for example, 1,4-cyclohexylenebis (oxymethyl) diacrylate,
1,4-cyclohexylenebis (oxyethyl) diacrylate,
1,4-cyclohexylenebis (oxypropyl) diacrylate,
1,4-cyclohexylenebis (oxybutyl) diacrylate,
1,4-cyclohexylenebis (oxypentyl) diacrylate and
1,4-cyclohexylenebis (oxyhexyl) diacrylate.

These monomers can be prepared by reacting acryloyl (or methacryloyl) chloride with an hydroxy alkoxycyclohexane as described in U.S. Pat. No. 4,767,883.

Other useful multifunctional acrylates include bis(4-acryloyloxybutyl)terephthalate,
bis(acryloyloxypropyl)terephthalate,
1,3-cyclohexanedimethanol diacrylate,
bis(2-acryloyloxyethyl)isophthalate, bis(2-acryloyloxyethyl)terephthalate,
1,4-bis(2-acryloyloxyethoxy)benzene,
1,4-bis(2-acryloyloxyethoxy)cyclohexane dicarboxylate,
1,3-bis(2-acryloyloxyethoxy)benzene,
bis(4-acryloyloxybutyl)isophthalate and
bis(acryloyloxypropyl)isophthalate.

Other useful polymerizable multifunctional monomers include multifunctional acrylamides such as xylylene-bis(acrylamide) and alkylene(bis-acrylamides) where alkylene preferably contains 1 to 8 carbon atoms.

Of course, any of the above monomers can be substituted with methacryl in place of the acryl.

In preferred embodiments, the polyimide portion of the polyimide-siloxane contains the phenylindane nucleus and/or an

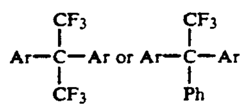

group (Ph=phenyl) in the dianhydride and/or diamine portion of the molecule. The phenylindane nucleus and the groups depicted above confer solubility on the polyimide and/or hydrolytic stability.

In preferred embodiments, the polyimide is modified with a siloxane by reacting the polyamic acid with a diamine having the formula

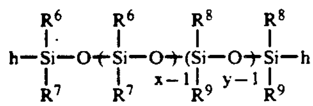

wherein x and y have the same significance as above, $R^6$, $R^7$, and $R^8$ are selected from methyl ($—CH_3$) or phenyl (—Ph), and $R^9$ is selected from methyl, phenyl, and 3,3,3-trifluoropropyl. Siloxanes with such groups are comparatively readily available. Furthermore, the presence of phenyl groups confers thermal stability. The methyl and trifluoropropyl groups confer flexibility. By selection of the number of phenyl, methyl, and trifluoropropyl groups, the practitioner can, at least within some extent, tailor the molecule to possess desired degrees of thermal stability and flexibility.

In the siloxane reactant, each h may be alike or different. Preferably both linking groups illustrated by the symbol h are the same. The groups indicated by h may be selected from lower alkylene groups such as methylene, $—CH_2—$, or higher homologs thereof, $—CH_2—_n$, wherein n is up to about 5, or the phenyl group. Siloxane reactants with such alkylene groups are preferred because they are more readily available. However, when thermal stability is highly desired, it is preferred that both h groups are phenyl.

Of the ethylenically unsaturated monomers which are useful in this invention, acrylates are preferred. Preferred acrylates are relatively thermally stable and noncrystalline. Such acrylates have an aryl group and also an aliphatic component. Illustrative acrylates of this type are illustrated by the following wherein R is a cyclohexyl group,

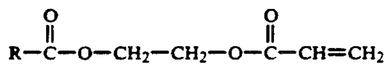

-continued $$R—O—CH_2—CH_2—O—\overset{O}{\overset{\|}{C}}—CH=CH_2$$

Examples of acrylates of this type are named above. Such materials are disclosed in above-cited U.S. Pat. No. 4,767,833 wherein they are illustrated by the formula:

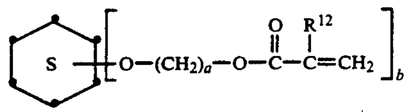

wherein
$R^{12}$ is H or $CH_3$
a is an integer of from 1 to 10 and
b is 1 or 2.

In an even more preferred embodiment, the cyclohexyl group R is replaced by an aryl group; preferably disubstituted on trisubstituted phenyl radicals wherein the substituents are acryloyloxyalkyl groups of the type mentioned above.

The compositions can be applied by any suitable method including spray coating, swirl coating, curtain coating, and the like conventional methods, either to a support film prior to application or to the substrate surface on which it is to be cured. The support can be rigid or flexible.

The compositions can be cured by heating or by exposure to uv or other activating radiation. Any suitable apparatus using any suitable solvent that will remove cured resist can be used to develop the image after exposure. Some suitable solvents include aqueous bases 1,1,1-trichloroethane, trichloromethane, acetone, benzene, toluene, alcohols, ethers, and the like and mixtures thereof.

The composition of the invention can include a photoinitiator which increases the speed of the composition. Any free-radical generating photoinitiator system can be used which initiates polymerization of the polymerizable monomer and does not subsequently terminate the polymerization. The free-radical generating photoinitiator system can comprise one or more compounds which directly furnish free radicals when activated by radiation. It can also comprise a plurality of compounds, one of which yields free radicals after having been caused to do so by a sensitizer which is activated by the radiation.

Representative useful examples of such photoinitiators include, for example, those described in British Patent No. 1,507,704, including benzophenone, acetophenone, ethyl methyl ketone, cyclopentanone, benzil, caprone, benzoyl cyclobutanone, and dioctyl acetone, particularly when used in admixture with substituted benzophenones such as Michler's ketone.

Highly preferred as the photoinitiator is a mixture of 3-ketocoumarin and an amine such as is described in U.S. Pat. No. 4,289,844. Representative amines include
ethyl-p-dimethylaminobenzoate,
other esters of p-dimethylaminobenzoic acid, e.g.,
n-butyl-p-dimethylaminobenzoate,
phenethyl-p-dimethylaminobenzoate,
2-phthalimidoethyl-p-dimethylaminobenzoate,
2-methacryloylethyl-p-dimethylaminobenzoate,
1,5-pentyl di-(p-dimethylamino)benzoate, 4,4'-bis(dimethylamino)benzophenone, phenethyl, and 1,5-pentyl esters of m-dimethylaminobenzoic acid,
p-dimethylaminobenzaldehyde,
2-chloro-4-dimethylaminobenzaldehyde,
p-dimethylaminoacetophenone,
p-dimethylaminobenzyl alcohol,
ethyl-(p-dimethylamino)benzoyl acetate,
p-N-piperidinoacetophenone,
4-dimethylamino benzoin,
N,N-dimethyl-p-toluidine,
N,N-diethyl-m-phenetidine,
tribenzyl amine,
dibenzylphenyl amine,
N-methyl-N-phenylbenzylamine,
p-bromo-N,N-dimethylaniline,
tridodecylamine,
4,4',4''-methylidyne,
(N,N-dimethylaniline) (crystal violet, leuco base),
3-indoleacetic acid, and
N-phenylglycine.

The coumarin associated with the amine can be one or more of, e.g., the following:
3-(2-benzofuroyl)-7-diethylaminocoumarin;
3-(2-benzofuroyl)-7-(1-pyrrolidinyl)coumarin;
7-dimethylamino-3-thenoylcoumarin;
3-benzoyl-7-diethylaminocoumarin;
3-(o-methoxybenzoyl)-diethylaminocoumarin;
3-(m-fluorosulfonyl)benzoyl-diethylaminocoumarin;
3-(p-dimethylaminobenzoyl)-diethylaminocoumarin;
3,3'-carbonylbis(5,7-di-n-propoxy coumarin);
3,3'-carbonylbis(7-diethylamino coumarin);
3-benzoyl-7-methoxycoumarin;
3-(2-furoyl)-7-diethylaminocoumarin;
3-(p-dimethylaminobenzoyl)-7-diethylaminocoumarin;
3-(p-diethylaminostyrylcarbonyl)-diethylamino-coumarin;
3-(p-morpholinostyrylcarbonyl)-diethylaminocoumarin;
9-(7-diethylamino-3-coumarinoyl)-1,2,4,5-tetrahydro-3H, 6H, 10H[1]benzopyrano[9,9a,1-gh]quinolazine-10-one and
9-(7-n-propylamino-3-coumarinoyl)-2,4,5-tetrahydro-3H, 6H, 10H[1]benzopyrano[9,9a,1-gh]quinolazine-10-one.

The photoinitiator composition can be present in an amount from 0.05 to about 10 weight percent, and preferably from 0.10 to 5 weight percent.

The composition of the invention can optionally include a variety of conventional addenda, examples of which are readily obtainable from the literature. For example, a filler can be selected to provide one or more of a variety of desirable properties to the second resist composition, such as lower cost, minimal shrinkage during cure, improved flatness, improved thermal conductivity, decreased tackiness, higher modulus, and/or the desired dielectric constant. Preferred fillers include titanox, mica particles, silica dioxide, glass beads (solid and hollow), alumina, alumina nitride, and aluminum borosilicate. The filler must not adversely affect the coatability of the resist and accordingly, is present in particles which are less than about 100 microns, preferably less than about 10 microns. Preferably from about 5 to about 10 microns in size. The filler can be present in an amount up to 80 weight percent preferably from about 10 to about 40 weight percent based on the weight of the solvent free second resist. The optimum filler loading depends of course on the particular filler selected and application and is readily determined by one skilled in the art. Particularly preferred fillers include titanox and mica particles.

The weight percents of the components of the second resist can be varied widely, based on the total weight of the solvent-free composition. The monomer noted above, can each be present in an amount from about 0.1 to about 90 weight percent, and preferably from 30 to 65 weight percent.

Inhibitors are often desirable for use with the monomers. Useful examples of inhibitors include hydroquinone, 3-t-butyl-4-hydroxy-5-methyl- phenyl sulfide, t-butylpyrocatechol and thiobis-4,4'-(2-tert-butyl-6-methylphenol).

Stabilizers, for example benzotriazole, can also be added, if desired.

The cured layer preferably has a thickness from 1 to about 250, more preferably 1.5 to 200 microns, although other thicknesses outside these ranges may also be useful in certain applications.

The photoresists useful in the practice of the invention can be applied to the metal layer by a wide variety of techniques, including coating techniques such as spray-coating, whirl-coating, curtain-coating, and the like, all of which are conventional.

Any suitable solvent can be selected for preparing a coating of either resist on the metallic layer. Typical examples include dichloromethane, acetone, benzene, acetates, alcohols, ethers, toluene, 1,1,1-trichloroethane, ethyl 3-ethoxypropionate, ethyl 3-methoxypropionate, 1-methoxy-2-propyl propionate, 1-methoxy-3-propyl acetate, 1-ethoxy-2-propyl acetate, 2-ethoxyethyl acetate, 2-methoxyethanol, 2-ethoxyethanol, propylene glycol monomethyl ether acetate, 2-methoxyethyl acetate, chlorobenzene, cyclohexanone and the like. The choice will depend of course upon the composition selected for the resist.

The laminate of the invention comprises the above-described metallic strip and resist layers. The second resist can optionally include a removable cover sheet. Such a sheet is particularly useful for formulations that tend to be somewhat tacky or oxygen sensitive. The cover sheet can be either preformed and then laminated to the resist layer, or it can be cast in place as a film from a water-soluble polymer. Examples of the former include cellulose esters such as cellulose triacetate, polyamides, polyolefins, vinyl polymers and polyesters. Examples of the latter include poly(vinyl alcohol) or hydroxyalkyl cellulose of from 1-2 carbon atoms in the alkyl portion.

The thickness of such cover sheets is not critical. However, an excessive thickness makes removal more difficult. For example, a thickness of 12 to about 50 microns can be used. A preferred thickness is from about 15 to about 25 microns.

A preferred method of storage of the laminate of the invention is in strip form coiled upon a suitable spool or mandrel into a roll. In such cases, the cover sheet is one which prevents transfer of monomer to the next adjacent section of the strip. Useful materials having such a property include polyester films.

The following preparations further illustrate the invention.

The polyimide-siloxanes were prepared by addition of an equal molar amount of the dianhydride to a solution of the diamines in tetrahydrofuran (THF) and/or N-methylpyrrolidone (NMP) at room temperature. The reaction was then stirred at room temperature overnight. To this solution, 3.5 molar equivalents of pyridine and 4.0 molar equivalents of acetic anhydride were added, and the reaction was then stirred overnight. The solution was precipitated into methanol, and the resultant fibrous polymer was chopped in a Waring blender. The polymer was then isolated by vacuum filtration, washed with methanol, and dried under vacuum at 100° C. overnight. The inherent viscosity (IV) of the polyimide-siloxane was determined in N,N-dimethylacetamide at 0.5 g/dL, 25° C.

The molecular weight of aminopropyl terminated dimethylsiloxane oligomer (Si50), determined by end-group titration, was 3840 g/mol, which corresponds to an average of approximately 50 dimethylsiloxane units per molecular, hence the acronym Si50.

PREPARATIVE EXAMPLE 1

Nv(0.8)Si50-6F: The polyimide-siloxane was prepared from 10.570 g (39.680 mmol) of 5-amino-(4-aminophenyl)-1,1,3-trimethylindane (Nv), 1.229 g (0.3200 mmol) of aminopropyl terminated dimethylsiloxane oligomer (Si50) and 17.77 g (40.00 mmol) of 2,2-bis(4-phthalic anhydride)hexafluoroisopropylidene (6F) in 115 g of THF, imidized with 11.1 g (140 mmol) of pyridine and 16.3 g (160 mmol) of acetic anhydride yielding 27.6 g (99%) of Nv(0.8)Si50-6F, IV=0.75 dL/g.

PREPARATIVE EXAMPLE 2

Nv(5)Si50-6F: The polyimide-siloxane was prepared from 10.12 g (38.00 mmol) of 5-amino-(4-aminophenyl)-1,1,3-trimethylindane (Nv), 7.680 g (2.0000 mmol) of aminopropyl terminated dimethylsiloxane oligomer (Si50) and 17.77 g (40.00 mmol) of 2,2-bis(4-phthalic anhydride)hexafluoroisopropylidene (6F) in 142 g of THF, imidized with 11.1 g (140 mmol) of pyridine and 16.3 g (160 mmol) of acetic anhydride yielding 31.9 g (93%) of Nv(5)Si50-6F, IV=0.87 dL/g.

PREPARATIVE EXAMPLE 3

Nv(10)Si50-6F: The polyimide-siloxane was prepared from 9.590 g (36.00 mmol) of 5-amino-(4-aminophenyl)-1,1,3-trimethylindane (Nv), 15.36 g (4.000 mmol) of aminopropyl terminated dimethylsiloxane oligomer (Si50) and 17.77 g (40.00 mmol) of 2,2-bis(4-phthalic anhydride)hexafluoroisopropylidene (6F) in 170 g of THF, imidized with 11.1 g (140 mmol) of pyridine and 16.3 g (160 mmol) of acetic anhydride yielding 39.6 g (99%) of Nv(10)Si50-6F, IV=0.53 dL/g.

The following negative-working resist formulation of Table I was coated at 55 microns dry thickness onto a 35 micron thick copper foil coated on one side with a 5 micron thick positive-working resist having the composition set forth in Table II to form a continuous film strip.

TABLE I

| | Composition of Negative-Working Resist | |
|---|---|---|
| (A) | Nv(0.8)Si50-6F polyimide-siloxane | 3.14 g |
| (B) | Tris(acryloyloxyethyl)-1,2,4-benzenetricarboxylate | 1.57 g |
| (C) | 1,3-Bis(2-acryloyloxyethoxy)benzene | 1.57 g |
| (D) | Photoinitiator Composition | |
| | Ethyl-p-dimethylaminobenzozate | 0.0941 g |
| | 3-(4-Cyanobenzoyl)-5,7-dipropoxycoumarin | 0.0308 g |
| (E) | Inhibitor | |
| | Thiobis-4,4'-(2-tert-butyl-6-methylphenol) | 0.0148 g |
| (F) | Methylene chloride | 13.2 g |

TABLE II

| | | Wt. % |
|---|---|---|
| (A) | Poly(hexamethylene-2,4-toluenedisulfonamide) | 13.64% |
| (B) | 1,2,4-Tris(6-diazo-5,6-naphthoquinone-1-sulfonyloxy)benzene-1,3,5-tris(6-diazo-5,6-naphthoquinone-1-sulfonyloxy)benzene | 1.364% |
| (C) | Acetone | 85.00% |

The sample was processed as follows:

(1) Both sides of the sample strip was exposed through a mask at a level of 360 mJ/cm$^2$ with an ORC Model No. HMW-201B exposure unit, and then the sample was heated at 90° C. for 2 minutes in a convection oven.

(2) Exposed positive-working resist was spray developed for 90 seconds in aqueous-diluted KMPR-809 developer (1:1) to completely remove the exposed areas. A final water rinse was used to remove all traces of developer.

(3) The unprotected copper foil (exposed areas) was chemically removed using a HCl-$CuCl_2$ spray etcher.

(4) The protective positive-working resist was then removed in a stripper of KMPR-809 developer and isopropanol.

(5) The exposed negative-working resist film was then ultrasonically developed with 1,1,1-trichloroethane to remove the unexposed areas.

(6) The strip was then baked in a vacuum oven for 60 minutes at 200° C. to remove solvent and increase polymerization of the monomers.

(7) The strip was then gold plated in neutral gold-cyanide/citric acid-citrate electrolyte plating bath.

(8) The processed tape was thermal compression bonded to gold bumped IC chips using an IMI model ILB-1200 bonder. The bonding cycle was for about 2 seconds at 48 psi with the thermode at 425° C. and the IC chip preheated to 150° C.

EXAMPLE 1

Example 1 demonstrates the formation for a spacer layer that adheres well to the copper and demonstrates little tendency to crack or break when processed through step 8. The spacer also exhibits good dimensional integrity and hardness at such processing temperatures. Moreover, the spacer provides improved hydrolytic stability and dielectric properties and lower moisture sensitivity compared to Example 1 of U.S. Pat. No. 4,792,517. For example, the layer did not substantially degrade at a temperature of 100° C. and a humidity of 100% RH. Additionally, the lower dielectric constant of the insulated support layer provides a desirable increase in signal speed compared to Example 1 of U.S. Pat. No. 4,792,517.

EXAMPLE 2

Example 1 was repeated with similar results when Nv(0.8)Si50-6F was replaced with Nv(5)Si50-6F.

EXAMPLE 3

Example 1 was repeated with similar results when Nv(0.8)Si50-6F was replaced with Nv(10)Si50-6F.

EXAMPLE 4

Example 1 was repeated with similar results when the formulation in Table I was replaced with the formulation in Table III.

TABLE III

| Composition of Negative-Working Second Resist | | |
|---|---|---|
| (A) | Nv(10)Si50-6F polyimide-siloxane | 3.14 g |
| (B) | Tris(acryloyloxyethyl)-1,2,4-benzenetri-carboxylate | 1.57 g |
| (C) | 1,3-Bis(2-acryloyloxyethoxy)benzene | 1.57 g |
| (D) | Photoinitiator Composition | |
| | Ethyl-p-dimethylaminobenzozate | 0.0941 g |
| | 3-(4-Cyanobenzoyl)-5,7-dipropoxycoumarin | 0.0308 g |
| (E) | Inhibitor | |
| | Thiobis-4,4'-(2-tert-butyl-6-methylphenol) | 0.0148 g |
| (F) | Methylene chloride | 15.5 g |
| (G) | Micro Mica 3000 | 1.11 g |

EXAMPLE 5

Example 1 was repeated with similar results when the formulation in Table I was replaced with the formulation in Table IV.

TABLE IV

| Composition of Negative-Working Second Resist | | |
|---|---|---|
| (A) | Nv(10)Si50-6F polyimide-siloxane | 3.14 g |
| (B) | Tris(acryloyloxyethyl)-1,2,4-benzenetri-carboxylate | 1.57 g |
| (C) | 1,3-Bis(2-acryloyloxyethoxy)benzene | 1.57 g |
| (D) | Photoinitiator Composition | |
| | Ethyl-p-dimethylaminobenzozate | 0.0941 g |
| | 3-(4-Cyanobenzoyl)-5,7-dipropoxycoumarin | 0.0308 g |
| (E) | Inhibitor | |
| | Thiobis-4,4'-(2-tert-butyl-6-methylphenol) | 0.0148 g |
| (F) | Methylene chloride | 18.8 g |
| (G) | Micro Mica 3000 | 2.69 g |

COMPARATIVE EXAMPLE

Using a synthesis procedure analogous to that given above, the polyimide-siloxane, Nv(20)Si2-6F was prepared, and Example 1 was repeated with Nv(20)Si2-6F replacing Nv(0.8)Si50-6F. Si2 is a 2 silicon containing monomer, bis(3-aminopropyl)tetramethyl-disiloxane. Thus, the comparative material produced contains a siloxane component with two silicons, and therefore has the short-chain type of siloxane (eight or less $$-\overset{|}{\underset{|}{Si}}-O-$$

linkages) suggested by Mueller. (Mueller of course does not disclose phenyl-indane-containing compositions.) The frames containing Nv(20)Si2-6F were more curled, the beam leads were out of plane, and it was much more difficult to successfully bond a chip to the beam frame.

The invention has been described in detail above with particular reference to preferred embodiments. A skilled practitioner, aware of the above-detailed description can make many modifications and substitutions without departing from the scope and spirit of th appended claims.

We claim:

1. A laminate comprising:
(a) a flexible metal strip,
(b) A layer of a first resist adhered to one surface of said metal strip, and
(c) a layer of a second resist adhered to the opposite surface of said metal strip, wherein said second resist is a negative-working resist which forms a semi-interpenetrating polymer network-II upon curing and comprises a homogeneous mixture of
(A) a solvent soluble linear polyimide-siloxane having from about 0.5 to about 30 weight percent silicon, said silicon being in siloxane units in said polyimide-siloxane, said siloxane units having from about 10 to about 200

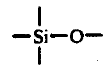

linkages per unit,
(B) an ethylenically unsaturated multifunctional monomer;
the relative concentration of (A) and (B) being such that said mixture provides upon curing a homogeneous blend of
(i) the polyimide portion of said polyimide-siloxane and
(ii) the polymer produced from said monomer, in which said siloxane portion of said polyimide-siloxane is phase separated.

2. The laminate of claim 1 wherein said siloxane units have from about 15 to about 200

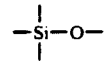

units per chain.

3. The laminate of claim 2 wherein said siloxane units have from about 40 to about 60

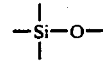

units per chain.

4. The laminate of claim 3 wherein the weight percent silicon is from about 0.05 to about 30.

5. The laminate of claim 1 wherein said polyimide-siloxane has the formula:

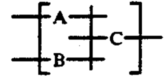

wherein A is selected from the class consisting of (i) phenylindane radicals having the structural formula:

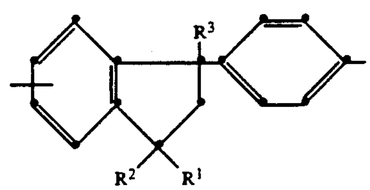

wherein $R^1$, $R^2$ and $R^3$ are individually H or or an alkyl group preferably containing from 1 to 5 carbon atoms; and (ii) groups having the structural formula:

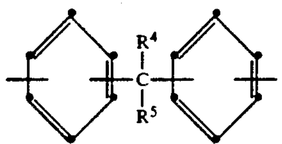

wherein $R^4$ and $R^5$ are individually H, alkyl of from 1 to 5 carbon atoms or fluoroalkyl having the formula $-(CH_2)_n-CF_3$ wherein n is 0-4;

B is a group having the structural formula:

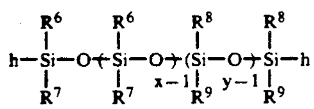

wherein h, $R^6$, $R^7$, $R^8$, and $R^9$ are selected from alkyl, and fluoroalkyl radicals of the type described above, and aryl radicals having up to about 10 carbon atoms; and C is selected from a group having the structural formula:

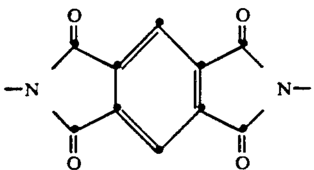

or

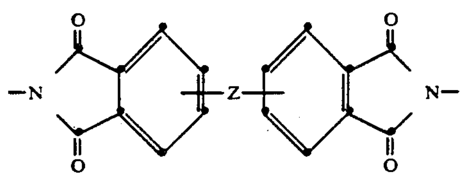

wherein Z is

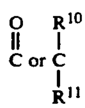

wherein $R^{10}$ and $R^{11}$ are H, alkyl or fluoroalkyl groups; said alkyl and fluoroalkyl groups being of the type described above.

6. The laminate of claim 5 wherein A is the phenylindane radical, B is

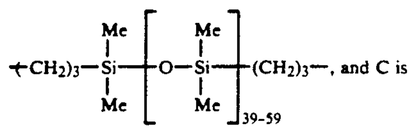

-continued

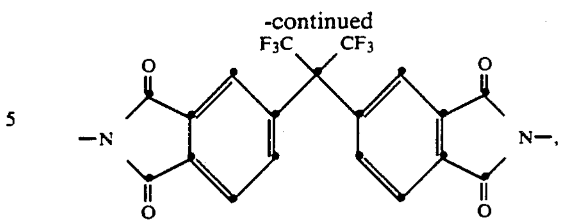

the molar proportion of A and B being from about 0.992A to 0.008B to 0.9A to 0.1B.

7. The laminate of claim 1 wherein said monomer is selected from the class consisting of tris (acryloyloxyethyl-1,2,4-benzenetricarboxylate, 1,4-cyclohexylenebis(oxyethyl)diacrylate and 1,3-bis(2-acryloyloxyethoxy)benzene.

8. The laminate of claim 1 wherein the relative proportion of unsaturated monomer to said polyimide-siloxane is from about 30 to 70, to about 70 to 30.

9. The laminate of claim 1 wherein the molecular weight of the polyimide portion of said polyimide-siloxane is from about 40 to about 60 to from about 60 to about 40.

10. The laminate of claim 8 additionally containing from about 0.05 to about 10 weight percent of a photoinitiator.

11. The laminate of claim 10 additionally containing from about 10 to about 40 weight percent (on a dry weight basis) of a filler, said filler being a particulate having a particle size of from about 5 to about 10 microns.

12. The laminate of claim 1 wherein said polymerizable multifunctional monomer is a diacrylate.

13. The laminate of claim 12 wherein said polymerizable multifunctional monomer is 1,4-cyclohexylenebis-(oxyalkyl)diacrylate.

14. The laminate of claim 12 wherein said polymerizable multifunctional monomer is tris(acryloxyethyl)-1,2,4-benzenetricarboxylate.

15. The laminate of claim 13 wherein said second resist further includes tris(acryloxyethyl)-1,2,4-benzenetricarboxylate.

16. The laminate of claim 1 wherein said polymerizable monomer is bis(2-acryloyloxyethyl)isophthalate.

17. The laminate of claim 1 wherein said polymerizable monomer is 1,3-bis(2-acryloyloxyethoxy)-benzene.

18. The laminate of claim 1 wherein said second resist includes a photoinitiator composition.

19. The laminate of claim 18 wherein said photoinitiator composition comprises a mixture of an amine and a 3-ketocoumarin.

20. The laminate of claim 1 wherein said second resist includes a filler selected from the group consisting of titanox and mica particles.

21. The laminate of claim 1 wherein said ethylenically unsaturated monomer has the formula:

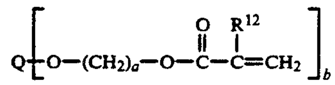

wherein $R^{12}$ is H or $CH_3$, a is an integer from 1 to 10, and

Q is cyclohexyl and b is 1 or 2, or Q is phenyl and b is 2 or 3.

* * * * *